United States Patent
Broodney et al.

(10) Patent No.: US 10,318,668 B2
(45) Date of Patent: Jun. 11, 2019

(54) AUTOMATIC DECOMPOSITION OF SIMULATION MODEL

(71) Applicant: International Business Machines Corporation, Armonk, NY (US)

(72) Inventors: Henry Broodney, Haifa (IL); Lev Greenberg, Haifa, NY (US); Michael Masin, Haifa (IL); Evgeny Shindin, Nesher (IL)

(73) Assignee: International Business Machine Corporation, Armonk, NY (US)

( * ) Notice: Subject to any disclaimer, the term of this patent is extended or adjusted under 35 U.S.C. 154(b) by 316 days.

(21) Appl. No.: 15/182,631

(22) Filed: Jun. 15, 2016

(65) Prior Publication Data

US 2017/0364613 A1    Dec. 21, 2017

(51) Int. Cl.
G06F 17/50    (2006.01)

(52) U.S. Cl.
CPC ............ G06F 17/5009 (2013.01); G05B 2219/23456 (2013.01)

(58) Field of Classification Search
CPC ............ G06G 9/5083; G06G 8/35; G05B 2219/23456
See application file for complete search history.

(56) References Cited

U.S. PATENT DOCUMENTS 6,415,384 B1 * 7/2002 Dave ............... G06F 17/5045
713/1
7,143,369 B1 * 11/2006 Milne ............... G06F 17/5022
716/102
7,194,726 B2 * 3/2007 Allen ............... G06F 17/5009
703/1

(Continued)

OTHER PUBLICATIONS

Wells et al. "Parallel Simulation of a Large-Scale Aerospace System in a Multicomputer Environment" IEEE Transactions on Aerospace and Electronic Systems, vol. 33, No. 2 (1997) [retrieved on Jun. 15, 2018]. Retrieved from <https://ieeexplore.ieee.org/document/575890>.*

(Continued)

*Primary Examiner* — Aniss Chad
*Assistant Examiner* — Alfred H B Wechselberger
(74) *Attorney, Agent, or Firm* — Ziv Glazberg (57) ABSTRACT

Method, system and product for decomposing a simulation model. The method comprising automatically decomposing the simulation model into a predetermined number of co-simulation components, wherein each co-simulation component is allocated to a different simulation platform, wherein said automatically decomposing comprises: defining a target optimization function, wherein the target optimization function computes an estimated run time of the simulation model, wherein the target optimization function is based on a communication time within each co-simulation component and a communication time between each pair of co-simulation components; and determining a decomposition of the simulation model that optimizes a value of the target optimization function. The method further comprises executing the decomposed simulation model by executing in parallel each co-simulation component on a different simulation platform, whereby the simulation model is executed in a distributed manner.

15 Claims, 4 Drawing Sheets

(56) References Cited

U.S. PATENT DOCUMENTS

| | | | | |
|---|---|---|---|---|
| 8,099,711 | B2* | 1/2012 | Bahrs | G06F 21/62 717/105 |
| 8,117,288 | B2* | 2/2012 | Bhanot | G06F 9/5066 709/201 |
| 8,990,783 | B1* | 3/2015 | Yu | G06F 8/35 703/22 |
| 2006/0106938 | A1* | 5/2006 | Dini | G06F 11/008 709/228 |
| 2009/0089029 | A1* | 4/2009 | Sturrock | G05B 17/02 703/7 |
| 2009/0216515 | A1* | 8/2009 | Moorby | G06F 17/5022 703/14 |
| 2010/0262559 | A1* | 10/2010 | Wilcock | G06Q 10/00 705/348 |
| 2012/0022847 | A1 | 1/2012 | Bailey et al. | |
| 2012/0233486 | A1* | 9/2012 | Phull | G06F 9/5083 713/375 |
| 2012/0296619 | A1* | 11/2012 | Maliassov | E21B 43/00 703/10 |

OTHER PUBLICATIONS

Boulahia-Cuppens et al. "Decomposition of Multilevel Objects in an Object-Oriented Database" ESORICS 1994: Computer Security, pp. 375-402 [retrieved on Nov. 12, 2018]. Retrieved from <https://link.springer.com/chapter/10.1007/3-540-58618-0_75> (Year: 2005).*

Chen et al. "Reliable Migration Module in Trusted Cloud based on Security Level-Design and Implementation" [retrieved from Nov. 12, 2018]. Retrieved from <https://ieeexplore.ieee.org/abstract/document/6270586> (Year: 2012).*

Chiola et al. "Distributed Simulation of Timed Petri Nets: Exploiting the Net Structure to Obtain Efficiency" ICATPN 1993. Lecture Notes in Computer Science, vol. 691. Springer [retrieved on Jan. 25, 2019]. Retrieved from <https://link.springer.com/chapter/10.1007/3-540-56863-8_45> (Year: 1993).*

Dietrich et al. "Scalar and Parallel Optimized Implementation of the Direct Simulation Monte Carlo" Journal of Computational Physics, vol. 126, Iss. 2, pp. 328-342 [retrieved on Jan. 25, 2019]. Retrieved from <https://www.sciencedirect.com/science/article/pii/S0021999196901412> (Year: 1996).*

Hudak et al. "Distributed Execution of Functional Programs Using Serial Combinators" IEEE Transactions on Computes, vol. C-34, Iss. 10 [retrieved on Jan. 25, 2019]. Retrieved from <https://ieeexplore.ieee.org/abstract/document/6312191> (Year: 1985).*

Mechoso et al. "Parallelization and Distribution of a Coupled Atmosphere-Ocean General Circulation Model" Monthly Weather Review, Jul. 1993 [retrieved on Jan. 25, 2019]. Retrieved from <https://journals.ametsoc.org/doi/abs/10.1175/1520-0493(1993)121%3C2062:PADOAC%3E2.0.CO%3B2> (Year: 1993).*

Aguilar et al. "Task Assignment and Transaction Clustering Heuristics for Distributed Systems" Information Sciences, vol. 97, Iss. 1-2 [retrieved on Jan. 25, 2019]. Retrieved from <http://citeseerx.ist.psu.edu/viewdoc/download?doi=10.1.1.472.1089&rep=rep1&type=pdf> (Year: 1997).*

AJ Alt and Philip A. Wilsey., "Profile Driven Partitioning of Parallel Simulation Models", Proceedings of the Winter Simulation Conference 2014, Date of Conference: Dec. 7-10, 2014, pp. 2750-2761.

* cited by examiner

AUTOMATIC DECOMPOSITION OF SIMULATION MODEL

TECHNICAL FIELD

The present disclosure relates to distributed simulation in general, and to automatic decomposition of simulation models, in particular.

BACKGROUND

A computer simulation is a computation that models the behavior of a system over time. Computer simulation consists in a set of techniques that are fundamental for the performance evaluation of existing systems. In some cases the computer simulation may be distributed simulation, i.e. a simulation in which more than one processor is employed. Distributed simulation may be efficient in faster obtaining of results, simulating larger scenarios, integrating simulators that are geographically distributed, composing different simulation models in a single simulator, or the like.

Distributed simulation techniques aim at an acceleration of the execution of simulation models by spatial decomposition and concurrent simulation of sub-models, using the concept of logical process, each one executing on a dedicated node of a multiprocessor system.

BRIEF SUMMARY

One exemplary embodiment of the disclosed subject matter is a computer-implemented method for decomposing a simulation model, the method comprising: obtaining the simulation model; automatically decomposing the simulation model into a predetermined number of co-simulation components, wherein each co-simulation component is allocated to a different simulation platform, wherein said automatically decomposing comprises: defining a target optimization function, wherein the target optimization function computes an estimated run time of the simulation model, wherein the target optimization function is based on a communication time within each co-simulation component and a communication time between each pair of co-simulation components; and determining a decomposition of the simulation model that optimizes a value of the target optimization function; and executing the decomposed simulation model by executing in parallel each co-simulation component on a different simulation platform, whereby the simulation model is executed in a distributed manner.

Another exemplary embodiment of the disclosed subject matter is a computerized apparatus having a processor, the processor being adapted to perform a method for decomposing a simulation model, the method comprising: obtaining the simulation model; automatically decomposing the simulation model into a predetermined number of co-simulation components, wherein each co-simulation component is allocated to a different simulation platform, wherein said automatically decomposing comprises: defining a target optimization function, wherein the target optimization function computes an estimated run time of the simulation model, wherein the target optimization function is based on a communication time within each co-simulation component and a communication time between each pair of co-simulation components; and determining a decomposition of the simulation model that optimizes a value of the target optimization function; and the method further comprises executing the decomposed simulation model by executing in parallel each co-simulation component on a different simulation platform, whereby the simulation model is executed in a distributed manner.

Yet another exemplary embodiment of the disclosed subject matter is a computer program product for decomposing a simulation model, the computer program product comprising a non-transitory computer readable storage medium retaining program instructions, which program instructions when read by a processor, cause the processor to perform a method comprising: obtaining the simulation model; automatically decomposing the simulation model into a predetermined number of co-simulation components, wherein each co-simulation component is allocated to a different simulation platform, wherein said automatically decomposing comprises: defining a target optimization function, wherein the target optimization function computes an estimated run time of the simulation model, wherein the target optimization function is based on a communication time within each co-simulation component and a communication time between each pair of co-simulation components; and determining a decomposition of the simulation model that optimizes a value of the target optimization function; and executing the decomposed simulation model by executing in parallel each co-simulation component on a different simulation platform, whereby the simulation model is executed in a distributed manner.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

One technical problem dealt with by the disclosed subject matter is to provide for performance improvement of simulated execution of a simulation model. Such improvement may be achieved by automatically decomposing the simulation model to co-simulation components. Each co-simulation component may be allocated to a different simulation platform. The different simulation platforms may be executed in concert to provide for a simulated execution of the simulation model. In some cases, however, the performance improvements may be dependent on the specific details of the decomposition of the simulation model.

In some exemplary embodiments, a simulation model may be a digital prototype of a physical model or a system. The simulation model may be used to predict performance of the physical model or the system in the real world. Simulation models may be used for optimizing geometry for weight and strength, selecting materials that meet weight, strength, and budget requirements, simulating part failure and identifying the loading conditions that cause them, assessing extreme environmental conditions or loads not easily tested on physical prototypes, such as earthquake shock load, verifying hand calculations, validating the likely safety and survival of a physical prototype, or the like.

In some exemplary embodiments, the simulation model may comprise processing elements. Each processing element may represent a part of the physical model or the system being simulated by the simulation model. Pairs of the processing elements may be connected by communication links. A communication link between a pair of processing elements may represent communication between the parts of the model or the system being simulated by the simulation model. In some cases, a communication link may be directional or non-directional.

As an example, a simulation model of a water molecule may comprise two processing elements representing the hydrogen atoms and one processing element representing the oxygen atom. Each hydrogen processing element may be connected to the oxygen processing element by a communication link. In some exemplary embodiments, the communication link between the hydrogen processing element and the oxygen processing element may have properties simulating properties of the chemical connection between the hydrogen atom and the oxygen atom within the water molecule. The simulation model of the water molecule may create a visual interpretation of $H_2O$— the chemical representation of the water molecule. Water molecules can be viewed under powerful microscopes. The simulation model of the water molecule may be useful when trying to explain the core properties of the water molecule.

Another example may be a simulation model of a factory workflow. Each machine in the factory may be modeled as a processing element that takes a certain amount of time to create a particular part. The time to move parts between machines, the number of parts, the rate of moving the parts, or the time at which the raw material and the work orders come into the factory may be modeled by the communication links. Based on all these, the simulation model may determine whether the output of the factory meets the demand. Raw material coming into a factory may be approximated as coming in at fixed intervals. Computer simulators may apply realistic simulations by using scripts and codes similar to a real situation or even an exact recording of a real situation.

Another technical problem dealt with by the disclosed subject matter is protection of simulation model Intellectual Property (IP). In some cases, different component of a simulation model may have different IP levels. To protect components with high level of IP they might need to be executed on a separate server with corresponding protection protocols, which may be physically separated and protected or the like.

One technical solution is to decompose each simulation model into co-simulation components by defining a target optimization function that computes an estimated run time of the simulation model and determining a decomposition of the simulation model that maximizes the target optimization function. In some exemplary embodiments, the target optimization function may be based on a communication time within each co-simulation component and a communication time between each pair of co-simulation components.

In some exemplary embodiments, a set of processing elements may be selected for each co-simulation component. Each set processing elements may be allocated to a different simulation platform to be executed by the different simulation platform upon execution of the simulation model.

In some exemplary embodiments, the target optimization function that computes the estimated run time of the simulation model may be $$\mathop{\mathrm{Max}}_{\forall c_i}[ET(c_i)] + \mathop{\mathrm{Max}}_{\forall (c_i,c_j)}[CT(c_i c_j)].$$

$c_i$ may be a co-simulation component of the decomposed model. $ET(c_i)$ may be an execution time of the co-simulation component $c_i$. In some exemplary embodiments, the execution time of the co-simulation component may be a summation of the execution time of each processing element comprised by the co-simulation component and a communication time of each communication link within the co-simulation component (e.g., intra-component communication time). $(c_i,c_j)$ may be a pair of co-simulation components, $c_i$ and $c_j$, selected from the decomposed simulation model. $CT(c_i,c_j)$ may be a communication time between the pair of co-simulation components. In some exemplary embodiments, the communication time between the pair of co-simulation components may be computed based on communication time of each communication link in between the pair of co-simulation components (e.g., inter-components communication time). Communication links in between a pair of co-simulation components may be communication link that connects a processing element from the first co-simulation component with a processing element from the second co-simulation elements. It will be noted that in some embodiments, intra-component communication may be more efficient than inter-component communication time. Additionally or alternatively, intra-component communication time may be significantly lower than inter-components communication time for a same amount of communication data.

Another technical solution is to decompose the simulation model into co-simulation components based on a property of the simulation model. In some exemplary embodiments, the property of the simulation model may be a computational power of each simulation platform, a latency between each pair of simulation platform, a security level of each simulation platform, or the like. Additionally or alternatively, the decomposition of the simulation model into co-simulation components may be determined based on a property of a simulation platform. In some exemplary embodiments, the property of the simulation platform may a minimal security level of a simulation platform that is used to execute a processing element, a performance requirement of executing the simulation model, or the like.

Properties of the simulation models may include, but are not limited to, type and number of communication links between processing elements of the simulation model, response time of processing elements, computational complexity of processing elements, IP level of processing elements.

Properties of the simulation platforms may include, but are not limited to, the number of distributed simulation platforms and their computation power (such as memory, number of cores, or the like), latency between simulation platforms, Security level of simulation platforms. In some exemplary embodiments, the properties may be provided by a user, be discovered by an analysis of the simulation platforms, such as by performing profiling or other dynamic analysis method during execution of the simulation platforms, or the like.

In some exemplary embodiments, the decomposition of the simulation model may be performed while taking into account a set of constraints, such as a constraint resulting from the property of the simulation model, a constraint resulting from the property of the simulation platforms, or the like. As an example, the simulation model may be decomposed according to a constraint resulting from performance requirements of the simulation model (e.g., Service Level Agreement (SLA) requirement for performing a function), a constraint resulting from security requirements of the simulation model (e.g., IP protection requirement), or the like.

In some exemplary embodiments, each co-simulation component may be wrapped with a co-simulation wrapper for providing API to and from the co-simulation component, such as High-Level Architecture (HLA), Functional Mockup Interface (FMI), or the like. Additionally or alternatively, each co-simulation component may be deployed as a distributed simulation.

In some exemplary embodiments, static analysis of the simulation model may be performed to determine the property of simulation model. Additionally or alternatively, dynamic analysis, such as profiling, of the simulation platform may be performed while the simulation model is being executed to determine the property of the simulation platform.

One technical effect of the disclosed subject matter is to execute simulation models on a plurality of simulation platforms simultaneously, while potentially minimizing the monetary cost. The disclosed subject matter may provide for an automatic manner of decomposition of simulation models and execution of the decomposed simulation models on different simulation platforms without requiring specific human design, costly design phase and high maintenance costs. Additionally or alternatively, the disclosed subject matter automatically takes into account constraints related to the simulation models, properties of the simulation platforms, or the like. Additionally or alternatively, embodiments of the disclosed subject matter may reduce the effort involved in establishing a performance and privacy-maintaining deployment of the simulation models. Additionally or alternatively, embodiments of the disclosed subject matter may reduce the manual effort that is required for a proper decomposition of models that is time consuming, error-prone and hard for adoption of models modification.

One technical solution is to decompose each simulation model into co-simulation components by defining a target optimization function that computes an estimated run time of the simulation model and determining a decomposition of the simulation model that maximizes the target optimization function. In some exemplary embodiments, the target optimization function may be based on a communication time within each co-simulation component and a communication time between each pair of co-simulation components.

Figure 1A:
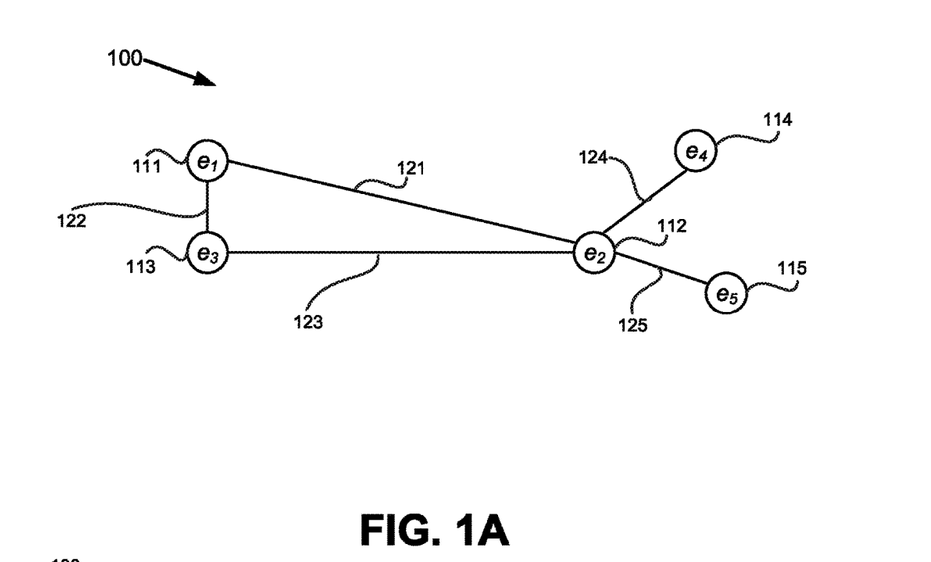
FIGS. 1A and 1B show schematic illustrations of a simulation model, in accordance with some exemplary embodiments of the subject matter.

Referring now to FIG. 1A showing a schematic illustration of a simulation model, in accordance with some exemplary embodiments of the subject matter.

In some exemplary embodiments, a Simulation Model 100 may be a computational model that is used to simulate a physical object, system or the like, hereinafter referred to for simplicity as the physical object. Simulation Model 100 may predict functionality, performance, operation, or the like of the physical object in the real world. Simulation Model 100 may provide information about how the physical object is expected to behave. In some exemplary embodiments, using Simulation Model 100 may provide for expected outcomes of the physical object's functionality and interaction with other objects, without having to test the physical object itself.

In some exemplary embodiments, Simulation Model 100 may comprise processing elements, such as Processing Element $e_1$ 111, Processing Element $e_2$ 112, Processing Element $e_3$ 113, Processing Element $e_4$ 114 and Processing Element $e_5$ 115. Processing Elements 111, 112, 113, 114, 115 may be computational elements simulating units of the physical object simulated by Simulation Model 100. In some exemplary embodiments, the units may be processing units, sub-units of the physical object, or the like.

In some exemplary embodiments, Simulation Model 100 may comprise communication links between the processing elements, such as Communication Link $(e_1,e_2)$ 121, Communication Link $(e_1,e_3)$ 122, Communication Link $(e_2,e_3)$ 123, Communication Link $(e_2,e_4)$ 124, and Communication Link $(e_2,e_5)$ 125. The communication links may represent communications between units, such as data from one unit may affect functionality of another object. In some exemplary embodiments, the communication link is directional and may indicate communication flow from one unit to another. Additionally or alternatively, the communication link may be unidirectional and may indicate data flows in both directions of the communication link.

In some exemplary embodiments, each processing element may have an associated effective processing time $p_n$ per simulation step. The effective processing time may be derived from the computational complexity of the processing elements, number of cores, or the like. Each communication link $(e_i,e_j)$ may have an associated average communication time per step, $s_{ij}$, representing the average communication time when both processing elements connected by the link are being executed on the same simulation platform; and an associated average communication time between simulation platforms per step, $t_{ij}$, representing the average communication time of the link when each processing elements connected by the link is being executed on a different simulation platform. In some exemplary embodiments, it may be expected that $s_{ij}$ may be significantly smaller than $t_{ij}$ ($s_{ij} \ll t_{ij}$).

Figure 1B:
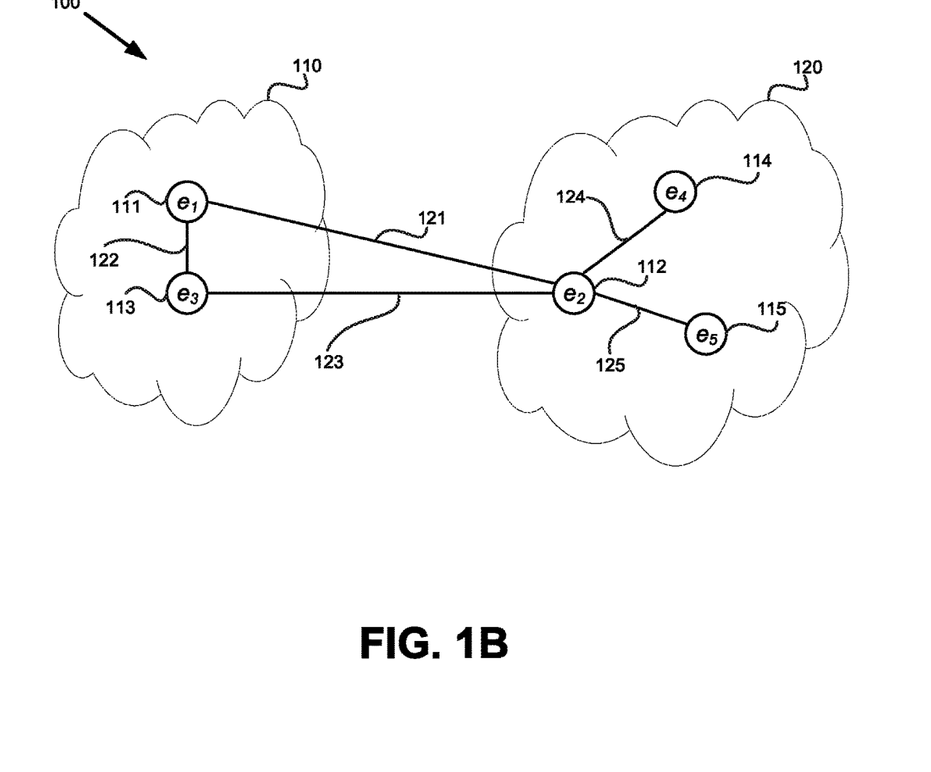

Referring now to FIG. 1B showing a schematic illustration of a possible decomposition of a simulation model, in accordance with some exemplary embodiments of the subject matter.

In some exemplary embodiments, Simulation Model 100 may be decomposed into two co-simulation components: Simulation Component 110 and Simulation Component 120.

In some exemplary embodiments, a target optimization function may be defined and used so as to automatically determine a suggested decomposition. The target optimization function may compute the estimated run time of Simulation Model 100 as decomposed. In some exemplary embodiments, minimizing the target optimization function may result in a decomposition that is associated with a minimal estimated run time. Additionally or alternatively, other cost metrics may be minimized in addition to or instead of overall estimated run time.

In some exemplary embodiments, The target optimization function may be computed as:

$$\underset{\forall c_i}{\text{Max}}[ET(c_i)] + \underset{\forall (c_i,c_j)}{\text{Max}}\lfloor CT(c_i c_j)\rfloor,$$

where $c_i$ may be a co-simulation component of the decomposed model, ET( ) may be an execution time of the co-simulation component; In some exemplary embodiments, the execution time of the co-simulation component may be a summation of the execution time of each processing element comprised by the co-simulation component and a communication time of each communication link within the co-simulation component (e.g., intra-component communication time). $(c_i, c_j)$ may be a pair of co-simulation components, $c_i$ and $c_j$, selected from the decomposed simulation model. CT( ) may be a communication time between the pair of co-simulation components. In some exemplary embodiments, the communication time between the pair of co-simulation components may be computed based on communication time of each communication link in between the pair of co-simulation components (e.g., inter-components communication time).

In some exemplary embodiments, each potential decomposition of Simulation Model 100 may be associated with a value for the target optimization function. A decomposition having a minimal value, a value below a threshold, or the like, may be selected as an automatically suggested decomposition. In some exemplary embodiments, only decomposition models that hold certain constraints, such as IP security level constraint, may be examined as potentially acceptable decompositions of the model.

As an example. FIG. 1B depicts a suggested decomposition of Simulation Model 100 where Simulation Component 110 comprises Processing Element $e_1$ 111 and Processing Element $e_3$ 113, and where Simulation Component 120 comprises Processing Element $e_2$ 112, Processing Element $e_4$ 114 and Processing Element $e_5$ 115. Accordingly, Communication Link 121 is within Simulation Component 110, Communication Links 124 and 125 are within Simulation Component 120 (i.e., intra-component link), while Communication Links 122 and 123 are in between within Simulation Component 110 and Simulation Component 120 (i.e., inter-components links).

In such suggested decomposition, the target optimization function may be computed as: $\text{Max}[ET(c_1), ET(c_2)] + \text{Max}[CT(c_1, c_2)]$, where $c_1$ may represent Simulation Component 110 and $c_2$ may represent Simulation Component 120. Accordingly, the target optimization function may be computed as: $\text{Max}[(p_1 + p_3 + s_{13}), (p_2 + p_4 + p_5 + s_{24} + s_{25})] + \text{Max}[t_{12} + t_{23}]$.

Figure 2A:
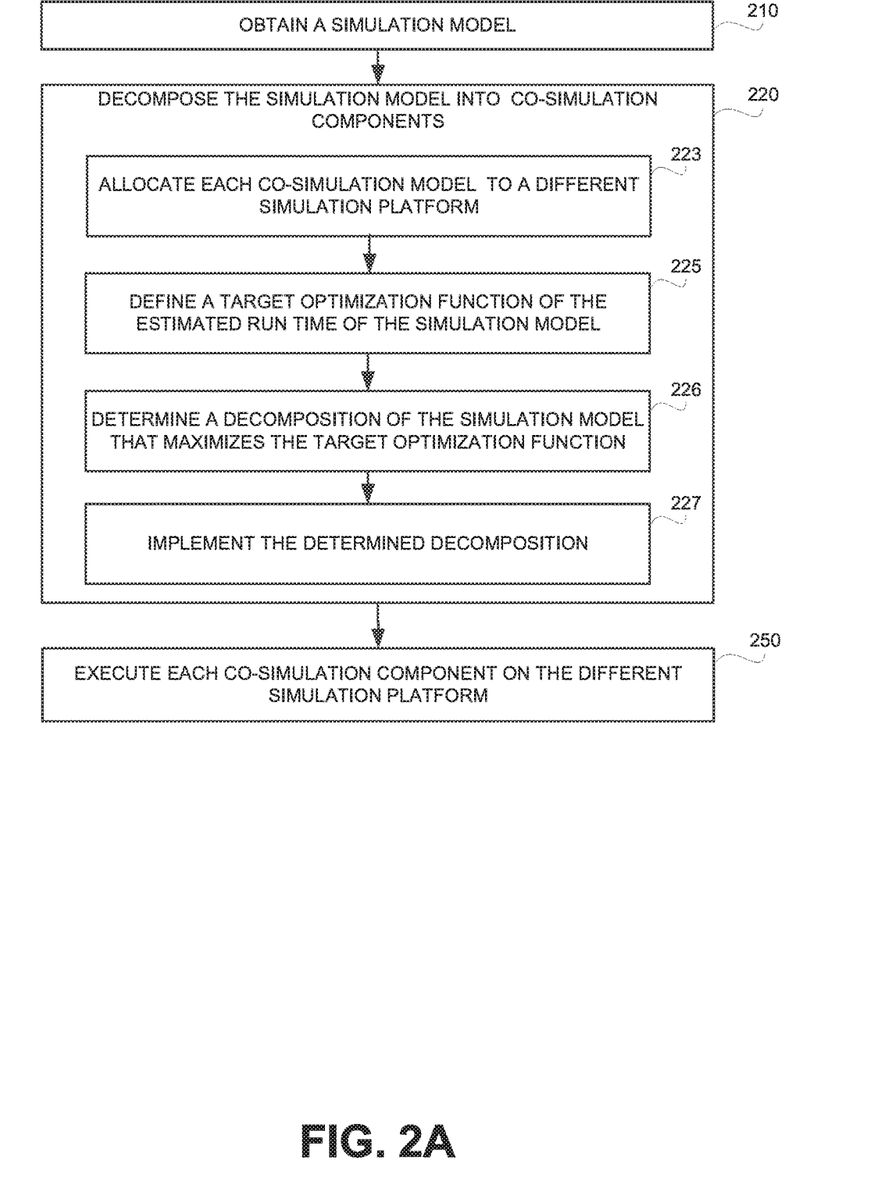
FIGS. 2A and 2B show flowchart diagrams of methods, in accordance with some exemplary embodiments of the subject matter.

Referring now to FIG. 2A showing a flowchart diagram of a method, in accordance with some exemplary embodiments of the subject matter.

In Step 210, a simulation model may be obtained. In some exemplary embodiments, the simulation model may comprise processing elements and communication links between pairs of processing elements. The processing elements may be computational elements simulating units of the physical object. In some exemplary embodiments, the simulation model may be provided in computer-readable form, such as retained in a non-transitory computer readable medium.

In Step 220, the simulation model may be decomposed into a predetermined number of co-simulation components. In some exemplary embodiments, the decomposition may be performed automatically or semi-automatically.

In Step 223, each co-simulation component may be allocated to a different simulation platform. In some exemplary embodiments, a number of available simulation platforms may be a limit as to the number of potential co-simulation components to decompose the model into.

In Step 225, a target optimization function may be defined. The target optimization function may compute an estimated run time of the simulation model as decomposed into the predetermined number of co-simulation components. In some exemplary embodiments, the target optimization function may be based on a communication time within each co-simulation component and a communication time between each pair of co-simulation components. Additionally or alternatively, the target optimization function may be associated with monetary cost of execution, such as for example, in case CPU resources are associated with a monetary cost which may differ from one platform to the other. Additionally or alternatively, other cost metrics may be used as a metric to be optimized by the target optimization functions.

In Step 226, a decomposition of the simulation model that minimizes the target optimization function may be determined. Additionally or alternatively, the target decomposition may be a decomposition that provides a best value to the target optimization function (e.g., minimal value, as may be the case with execution time, maximal value, as may be the case with quality level, or the like). Additionally or alternatively, the target decomposition may provide a sufficiently good and not necessarily optimal decomposition, such as a value below a minimal threshold, above a maximal threshold, or the like. In the present disclosure, the target optimization function is said to be "optimized" in case an optimal value or a sufficiently good value is obtained. In some exemplary embodiments, in Step 226, each potential decomposition of the simulation model may be reviewed and the value of the target optimization function may be computed. In some exemplary embodiments, brute force enumeration methods may be used to identify the decomposition providing optimal value for the target optimization function. Additionally or alternatively, heuristic approaches, approximations, or the like may be used to enhance efficiency of the search of the potential decomposition spaces, instead of simple brute force enumeration.

In Step 227, processing elements may be assigned to different co-simulation components in accordance with the determined optimal decomposition. As a result, the optimal decomposition may be implemented.

In Step 250, each co-simulation component may be executed on the different simulation platform. The co-simulation components may be executed in parallel, thereby providing for distributed simulation of the original, non-distributed, simulation model.

Figure 2B:
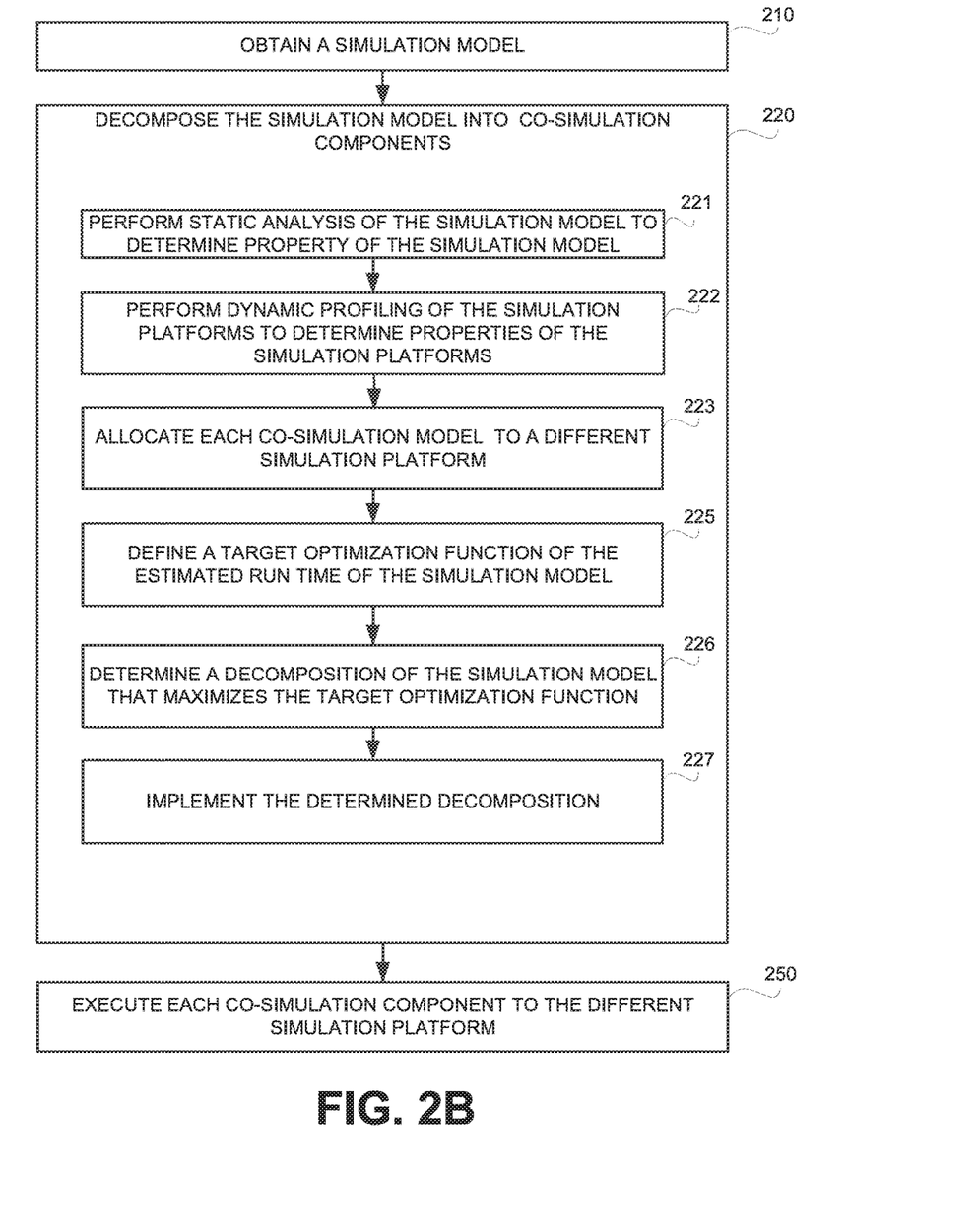

Referring now to FIG. 2B showing a flowchart diagram of a method in accordance with some exemplary embodiments of the subject matter.

In Step 220, the simulation model may be decomposed into a predetermined number of co-simulation components. Additionally or alternatively, a decomposition of the simulation model may be determined taking into account a set of constraints. The set of constraints may comprise one or more constraints resulting from the property of the simulation model, one or more constraints resulting from the property of the simulation platforms, or the like. In some exemplary embodiments, such properties may affect the target optimization function in addition to or instead of being related to constraints.

In Step 221, a static analysis of the simulation model may be performed to identify properties of the simulation model. In some exemplary embodiments, the properties of the simulation model may comprise a minimal security level of a simulation platform that is used to execute a processing element, a performance requirement of executing the simulation model or a processing entity or other portions thereof, or the like.

In Step 222, a dynamic profiling of the simulation platforms may be performed to determine one or more properties of each simulation platform. In some exemplary embodiments, the properties of a simulation platform may comprise a computational power of each simulation platform, a latency during communication between each pair of simulation platform, a security level of each simulation platform, or the like.

Figure 3:
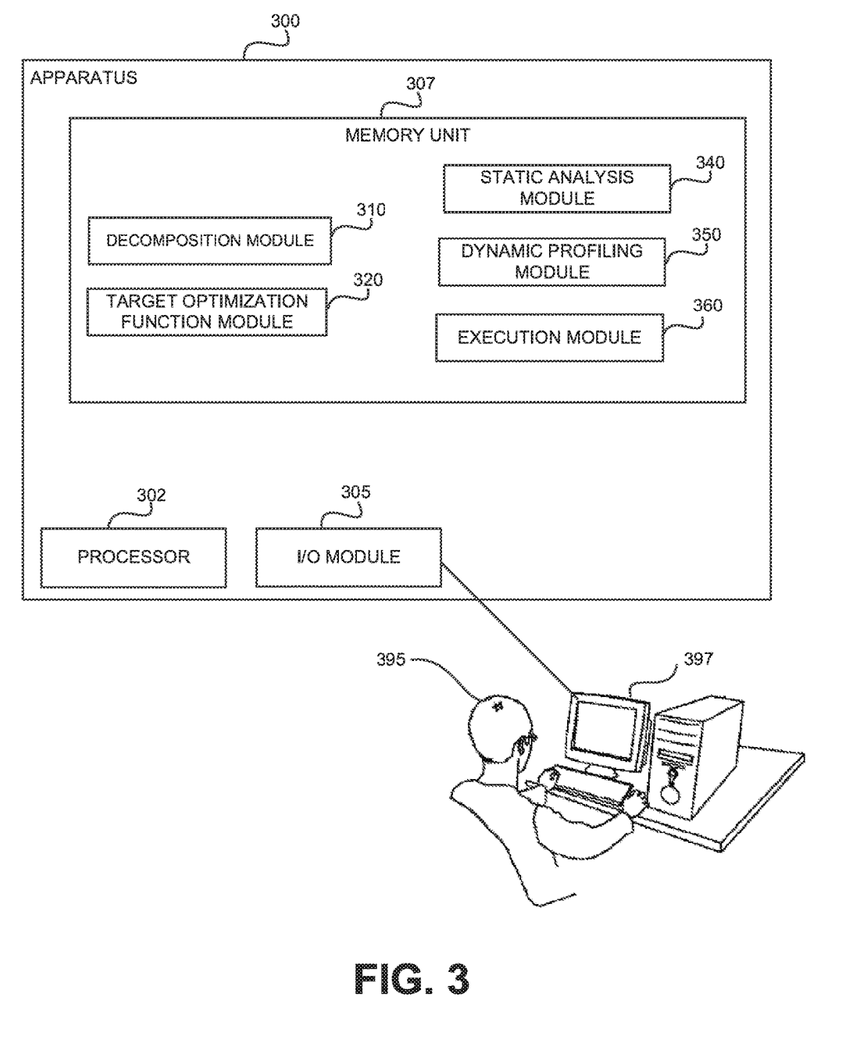
FIG. 3 shows a block diagram of an apparatus, in accordance with some exemplary embodiments of the disclosed subject matter.

Referring now to FIG. 3 showing a block diagram of an apparatus in accordance with some exemplary embodiments of the disclosed subject matter.

In some exemplary embodiments, Apparatus 300 may comprise one or more Processor(s) 302. Processor 302 may be a Central Processing Unit (CPU), a microprocessor, an electronic circuit, an Integrated Circuit (IC) or the like. Processor 302 may be utilized to perform computations required by Apparatus 300 or any of it subcomponents.

In some exemplary embodiments of the disclosed subject matter, Apparatus 300 may comprise an Input/Output (I/O) Module 305. Apparatus 300 may utilize I/O Module 305 as an interface to transmit and/or receive information and instructions between Apparatus 300 and external I/O devices, such as a Workstation 397, a Computing Device (not shown), or the like. In some exemplary embodiments, I/O Module 305 may provide an interface to a system or a physical model or an interface of a simulation model, and may be useful for instructing a simulation platform to execute a processing element, thereby executing a decomposition of a simulation model determined by Apparatus 300.

In some exemplary embodiments, I/O Module 305 may be used to provide an interface to a User 395 of the system, such as by providing output, outcome of simulation model decomposition, or the like. User 395 may use Workstation 397 to input a simulation model to be decomposed and executed on a plurality of simulation platforms. In some exemplary embodiments, the simulation model provided by I/O Module 305 may comprise processing elements and communication links between pairs of processing elements. In some exemplary embodiments, User 395 may provide user input indicating which constraints of the simulation model parts are restricted and to which simulation platform, indicate which processing elements of the simulation model are confidential and restricted, or the like. It will be appreciated that Apparatus 300 can operate without human operation.

In some exemplary embodiments, Apparatus 300 may comprise a Memory Unit 307. Memory Unit 307 may be a hard disk drive, a Flash disk, a Random Access Memory (RAM), a memory chip, or the like. In some exemplary embodiments, Memory Unit 307 may retain program code operative to cause Processor 302 to perform acts associated with any of the subcomponents of Apparatus 300.

In some exemplary embodiments, Memory Unit 307 may comprise a Decomposition Module 310. Decomposition Module 310 may be configured to automatically decompose a simulation model obtained by I/O Module into no more than a predetermined number of co-simulation components. Decomposition Module 310 may allocate each co-simulation component to a different simulation platform. In some exemplary embodiments, Decomposition Module 310 may be configured to determine for each co-simulation component, a set of one or more processing elements. Decomposition Module 310 may be configured to allocate each set of one or more processing elements to a different simulation platform to be executed by the different simulation platform upon execution of the simulation model by an Execution Module 360.

In some exemplary embodiments, Decomposition Module 310 may be configured to determine a decomposition of the simulation model that maximizes a target optimization function defined by a Target Optimization Function Module 320.

Target Optimization Function Module 320 may be configured to define a target optimization function that computes an estimated run time of the simulation model. In some exemplary embodiments, Target Optimization Function Module 320 may be configured to define the target optimization function based on a communication time within each co-simulation component of the simulation model and a communication time between each pair of co-simulation components.

In some exemplary embodiments, Target Optimization Function Module 320 may be configured to define a target optimization function as a summation of the maximal execution time of a co-simulation component selected from the co-simulation components determined by Decomposition Module 310 and the maximal communication time between a pair of co-simulation components. In some exemplary embodiments, the execution time of a co-simulation component may comprises a summation of the execution time of each processing element comprised by the co-simulation component and a communication time of each communication link connecting processing elements within the co-simulation component. In some exemplary embodiments, the communication time between each pair of co-simulation components may be computed based on communication time of each communication link that connects a pair of co-simulation components being allocated to different simulation platforms.

In some exemplary embodiments, Decomposition Module 310 may be configured to determine a decomposition of a simulation model based on a property of the simulation model. Additionally or alternatively, Decomposition Module 310 may be configured to determine a decomposition of a simulation model based on a property of the simulation platforms the de-composed model is being allocated to.

Additionally or alternatively, Decomposition Module 310 may be configured to determine a decomposition of the simulation model taking into account a set of constraints. The set of constraints may comprise a constraint resulting from the property of the simulation model and a constraint resulting from the property of the simulation platforms.

In some exemplary embodiments, Memory Unit 307 may comprise a Simulation Models Analysis Module 340. Simulation Models Analysis Module 340 may be configured to perform static analysis of the simulation model being analyzed by Decomposition Module 310 to determine the property of simulation model.

In some exemplary embodiments, Memory Unit 307 may comprise a Simulation Platform Profiling Module 350. Simulation Platform Profiling Module 350 may be configured to perform profiling of a simulation platform that a co-simulation component is being allocated to, to determine the property of the simulation platform.

In some exemplary embodiments, Memory Unit 307 may comprise an Execution Module 360. Execution Module 360 may be configured to execute co-simulation components determined by Decomposition Module 310. Execution Module 360 may be configured to execute processing elements comprised by each co-simulation by a different simulation platform.

An Embodiment

The following provides an illustrative non-limiting concrete embodiment of the disclosed subject matter.

In a simulation model there are 5 simulation tasks. The simulation system comprises 5 servers dedicated for simulation (e.g., simulation platforms). Tasks 1 and 3 of the model are required to be executed by "secure" servers (also referred to as secure tasks). Servers 1 and 2 are the only secure servers in the simulation system. Execution time of the task depends also on server power and given as server rate. Communication time between tasks allocated on the same server also depends on server power. Communication time between tasks on different servers depends on inter-server link bandwidth and given as inter-server link rate. Secure link between tasks should be allocated either to secure server or to secure inter-server link.

An optimization model using the Optimization Programming Language (OPL) may be provided as follows:

```
{int} tasks = ...;
float procTimes[t in tasks] = ...;
{int} secTasks = ...;
tuple Link {
    int t1;
    int t2;
    float intTime; //if tasks in the same server;
    float extTime; //if tasks in different servers;
    int isSecure;
};
{Link} links =...;
{int} servers = ...;
{int} secServers = ...;
tuple ServerLink {
    int s1;
    int s2;
    float interSeverLinkRate;
    int isSecure;
};
{ServerLink} sLinks =...;
float serverRate[s in servers] =...;
dvar boolean task2server[t in tasks][s in servers];
dvar float+ link2ss[l in links][s1 in servers][s2 in servers];
dvar float serverTime[s in servers];
dvar float interServerTime[sLinks];
dvar float maxServerTime;
dvar float maxInterServerTime;
minimize maxServerTime + maxInterServerTime;
subject to {
    forall(s in servers) maxServerTime >= serverTime[s] * serverRate[s];
    forall(L in sLinks) maxInterServerTime >= InterServerTime[L] * L.interSeverLinkRate;
    forall(L in sLinks: L.s1 == L.s2) interServerTime[L] == 0; //for faster processing
    forall(s in servers) serverTime[s] == sum(t in tasks) procTimes[t] * task2server[t][s] + sum(L in links) link2ss[L][s][s] * L.intTime;
    forall(sL in sLinks: sL.s1 != sL.s2) interServerTime[sL] == sum(L in links) link2ss[L][sL.s1][sL.s2] * L.extTime;
    forall(s1, s2 in servers: s1 != s2, l in links) link2ss[l][s1][s2] >= task2server[l.t1][s1] + task2server[l.t2][s1] + task2server[l.t1][s2] + task2server[l.t2][s2] - 1;
    forall(s1, s2 in servers: s1 != s2, l in links) link2ss[l][s1][s2] <= task2server[l.t1][s1] + task2server[l.t2][s1];
    forall(s1, s2 in servers: s1 != s2, l in links) link2ss[l][s1][s2] <= task2server[l.t1][s2] + task2server[l.t2][s2];
    forall(s1 in servers, l in links) link2ss[l][s1][s1] >= task2server[l.t1][s1] + task2server[l.t2][s1] - 1;
    forall(s1 in servers, l in links) link2ss[l][s1][s1] <= task2server[l.t1][s1];
    forall(s1 in servers, l in links) link2ss[l][s1][s1] <= task2server[l.t2][s1];
    forall(t in tasks diff secTasks) sum(s in servers) task2server[t][s] == 1; // each task should be allocated to server
    forall(t in secTasks) sum(s in secServers) task2server[t][s] == 1; // each secure task should be allocated to secure server
    forall(L in links: L.isSecure == 1) sum(sL in sLinks: sL.isSecure == 0) link2ss[L][sL.s1][sL.s2] == 0; // secure Link should NOT be allocated to unsecure link
    forall(L in links: L.isSecure == 1) sum(s1 in servers diff secServers) link2ss[L][s1][s1] == 0;    // secure link should NOT be allocated to unsecure server
}
```

The OPL data file may be as follows:

```
tasks = {1,2,3,4,5};
servers = {1,2,3,4,5};
links = {
    <1,2,0.01,2,0>
    <1,3,1,20,1>
    <2,3,0.1,2,0>
    <2,4,0.1,5,0>
    <2,5,0.01,2,0>
};
sLinks = {
    <1,2,1,1>
    <1,3,5,0>
    <1,4,5,0>
    <1,5,20,0>
    <2,3,5,0>
    <2,4,5,0>
    <2,5,20,0>
    <3,4,1,1>
    <3,5,5,0>
    <4,5,5,0>
};
serverRate = [  1.8 1 1.3 1.5 1.5  ];
procTimes = [   15 21 23 35 11   ];
secTasks = {1, 3};
secServers = {1, 2};
```

As an example, a solution to the above example may be automatic decomposition of the model so that task 3 is allocated to server 1, tasks 1 and 5 are allocated to server 2, task 4 is allocated to server 3, and task 2 is allocated to server 4. Server 5 remains unused. Such decomposition provides a maximum server time of 45.5 and maximum inter-server time of 20. Total processing time is therefore 65.5 which is an optimal processing time given the constraints of the model and the properties of the simulation system.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method for decomposing a simulation model, the method comprising:
   obtaining the simulation model;
   automatically decomposing the simulation model into a predetermined number of co-simulation components, wherein each co-simulation component is allocated to a different simulation platform, wherein said automatically decomposing comprises:
      defining a target optimization function, wherein the target optimization function computes an eliminated run time of the simulation model, wherein the target optimization function is based on a communication time within each co-simulation component and a communication time between each pair of co-simulation components; and
      determining a decomposition of the simulation model that optimizes a value of the target optimization function; and
   executing the decomposed simulation model by executing in parallel each co-simulation component on a different simulation platform, whereby the simulation model is executed in a distributed manner in a reduced run time in comparison to a non-distributed execution of the simulation model;
   wherein the simulation model comprises processing elements and communication links between pairs of processing elements, wherein said automatically decomposing comprises:
   determining, for each co-simulation component, a set of one or more processing elements, wherein each set of one or more processing elements is allocated to the different simulation platform allocated to the each co-simulation component, whereby the each set of one or more processing elements to be executed by the different simulation platform upon execution of the simulation model;
   wherein the target optimization function is $$\text{Max}_{\forall c_i}[ET(c_i)] + \text{Max}_{\forall (c_i, c_j)}[CT(c_i c_j)],$$

wherein ci is a co-simulation component selected from the co-simulation components, wherein $ET(c_i)$ is an execution time of the co-simulation component, wherein the execution time of the co-simulation component comprises a summation of the execution time of each processing element comprised by the co-simulation component and a communication time of each communication link within the co-simulation component;
   wherein $(c_i, c_j)$ is a pair of co-simulation components, $c_i$ and $c_j$, selected from the co-simulation components, wherein $CT(c_i, c_j)$ is a communication time between the pair of co-simulation components, wherein the communication time between the pair of co-simulation components is computed based on communication time of each communication link in between the pair of co-simulation components.

2. The computer-implemented method of claim 1, wherein said determining the decomposition is performed based on a property of the simulation model and based on a property of a simulation platform.

3. The computer-implemented method of claim 2, wherein said determining the decomposition is performed while taking into account a set of constraints, wherein the set of constraints comprises: a constraint resulting from the property of the simulation model and a constraint resulting from the property of the simulation platforms.

4. The computer-implemented method of claim 2, wherein the property of the simulation model is
   a minimal security level of a simulation platform that is used to execute a processing element.

5. The computer-implemented method of claim 2, wherein the property of the simulation platform is
   a security level of each simulation platform.

6. The computer-implemented method of claim 2 further comprising performing static analysis of the simulation model to determine the property of simulation model.

7. The computer-implemented method of claim 2, further comprising dynamically performing profiling of the simulation platform to determine the property of the simulation platform.

8. A computerized apparatus having a processor, the processor being adapted to perform a method for decomposing a simulation model, the method comprising:
   obtaining the simulation model, wherein the simulation model comprises processing elements and communication links between pairs of processing elements;
   automatically decomposing the simulation model into a predetermined number of co-simulation components, wherein each co-simulation component is allocated to a different simulation platform, wherein said automatically decomposing comprises:
      determining, for each co-simulation component, a set of one or more processing elements, wherein each set of one or more processing elements is allocated to the different simulation platform allocated to the each co-simulation component, whereby the each set of one or more processing elements to be executed by the different simulation platform upon execution of the simulation model;
      defining a target optimization function, wherein the target optimization function comprises an estimated run time of the simulation model, wherein the target optimization function is based on a communication time within each co-simulation component and a communication time between each pair of co-simulation components, wherein the target optimization function is $$\text{Max}_{\forall c_i}[ET(c_i)] + \text{Max}_{\forall (c_i, c_j)}[CT(c_i, c_j)],$$

wherein $c_i$ is a co-simulation component selected from the co-simulation components, wherein ET(ci) is an execution time of the co-simulation component, wherein the execution time of the co-simulation component comprises a summation of the execution time of each processing element comprised by the co-simulation component and a communication time of each communication link within the co-simulation component;
   wherein (ci,cj) is a pair of co-simulation components, ci and cj, selected from the co-simulation components, wherein CT(ci,cj) is a communication time between the pair of co-simulation components, wherein the communication time between the pair of co-simulation components is computed based on communication time of each communication link in between the pair of co-simulation components; and determining a decomposition of the simulation model that optimizes a value of the target optimization function; and executing the decomposed simulation model by executing in parallel each co-simulation component on a different simulation platform, whereby the simulation model is executed in a distributed manner in a reduced run time in comparison to a non-distributed execution of the simulation model.

9. The computerized apparatus of claim 8, wherein said determining the decomposition is performed based on a property of the simulation model and based on a property of a simulation platform.

10. The computerized apparatus of claim 9, wherein said determining the decomposition is performed while taking into account a set of constraints, wherein the set of constraints comprises: a constraint resulting from the property of the simulation model and a constraint resulting from the property of the simulation platforms.

11. The computerized apparatus of claim 9, wherein the property of the simulation model is
a minimal security level of a simulation platform that is used to execute a processing element.

12. The computerized apparatus of claim 9, wherein the property of the simulation platform is
a security level of each simulation platform.

13. The computerized apparatus of claim 10, wherein said processor is further configured to perform static analysis of the simulation model to determine the property of simulation model.

14. The computerized apparatus of claim 10, wherein said processor is further configured to dynamically perform profiling of the simulation platform to determine the property of the simulation platform.

15. A computer program product for decomposing a simulation model, the computer program product comprising a non-transitory computer readable storage medium retaining program instructions, which program instructions when read by a processor, cause the processor to perform a method comprising:

obtaining the simulation model, wherein the simulation model comprises processing elements and communication links between pairs of processing elements;

automatically decomposing the simulation model into a predetermined number of co-simulation components, wherein each co-simulation component is allocated to a different simulation platform, wherein said automatically decomposing comprises:

determining, for each co-simulation component, a set of one or more processing elements, wherein each set of one or more processing elements is allocated to the different simulation platform allocated to the each co-simulation component, whereby the each set of one or more processing elements to be executed by the different simulation platform upon execution of the simulation model;

defining a target optimization function, wherein the target optimization function computes an estimated run time of the simulation model, wherein the target optimization function is based on a communication time within each co-simulation component and a communication time between each pair of co-simulation components, wherein the target optimization function is $$\text{Max}_{\forall c_i}[ET(c_i)] + \text{Max}_{\forall (c_i, c_j)} \lfloor CT(c_i, c_j) \rfloor,$$

wherein $c_i$ is a co-simulation component selected from the co-simulation component selected from the co-simulation components, wherein $ET(ci)$ is an execution time of the co-simulation component, wherein the execution time of the co-simulation component comprises a summation of the execution time of each processing element comprised by the co-simulation component and a communication time of each communication link within the co-simulation component; wherein $(ci,cj)$ is a pair of co-simulation components, ci and cj, selected from the co-simulation components, wherein $CT(ci,cj)$ is a communication time between the pair of co-simulation components, wherein the communication time between the pair of co-simulation components is computed based on communication time of each communication link in between the pair of co-simulation components; and determining a decomposition of the simulation model that optimizes a value of the target optimization function; and executing the decomposed simulation model by executing in parallel each co-simulation component on a different simulation platform, whereby the simulation model is executed in a distributed manner in a reduced run time in comparison to a non-distributed execution of the simulation model.

* * * * *